United States Patent [19]

Sugo et al.

[11] Patent Number: 4,463,448

[45] Date of Patent: Jul. 31, 1984

[54] SEMICONDUCTOR MEMORY DEVICE

[75] Inventors: Yasuhisa Sugo; Kazuhiro Toyoda, both of Yokohama; Katuyuki Yamada, Kawasaki, all of Japan

[73] Assignee: Fujitsu Limited, Kawasaki, Japan

[21] Appl. No.: 333,812

[22] Filed: Dec. 23, 1981

[30] Foreign Application Priority Data

Dec. 24, 1980 [JP] Japan .................................. 55-183078

[51] Int. Cl.³ .............................................. G11C 7/00
[52] U.S. Cl. .................................................... 365/190
[58] Field of Search ............... 365/189, 190, 202, 203, 365/230, 154

[56] References Cited

U.S. PATENT DOCUMENTS 4,348,747  9/1982  Takahashi .......................... 365/189

Primary Examiner—Joseph A. Popek
Attorney, Agent, or Firm—Staas & Halsey

[57] ABSTRACT

A semiconductor memory device comprising a circuit which effects the flow of a discharge current to a selected word line, wherein a circuit for detecting change of a decoder input is provided, and thereby the discharge current flows temporarily only when the selected word line shifts to the non-selected condition.

9 Claims, 4 Drawing Figures

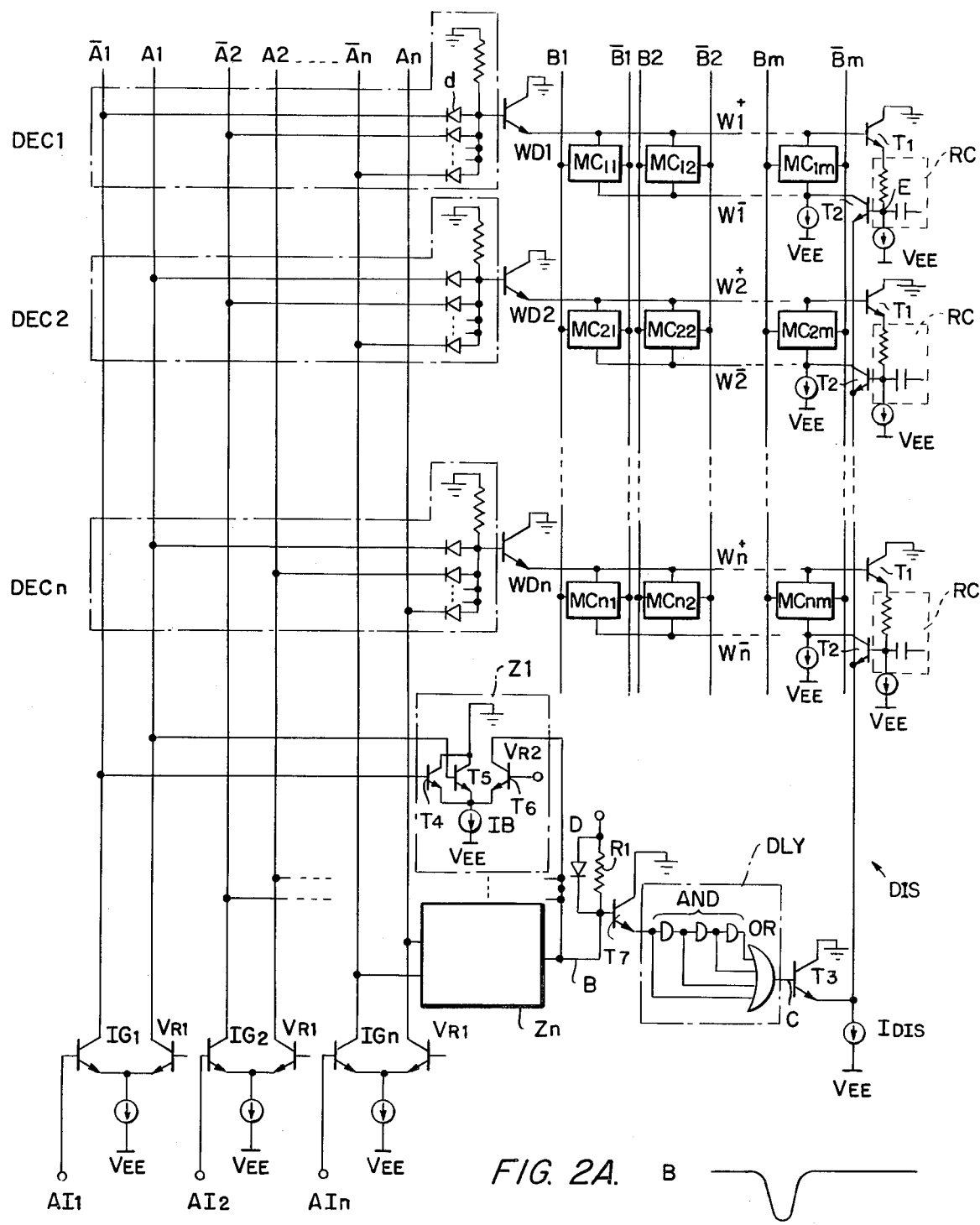

SEMICONDUCTOR MEMORY DEVICE

BACKGROUND OF THE INVENTION

(1) Field of the Invention

This invention relates to a semiconductor memory device, particularly to a memory device having a discharge means for improving the falling characteristic of the potential of a word line.

(2) Description of the Prior Art

A memory device, providing a so-called emitter detection type memory cell wherein a pair of npn type bipolar transistors are cross-coupled and the emitters of such pair of transistors are connected to a pair of bit lines, is often used. A memory device of this type facilitates the coupling between peripheral circuits constituted by ECL (Emitter Coupled Logic) circuits and memory cells, and simultaneously realizes a high speed readout operation. These are outstanding advantages of this type of memory device. Moreover, diversified improvements have been attempted in order to realize further high speed readout operation. For example, the reference readout level given to a transistor which connects a sense amplifier and a bit line is temporarily lowered when a potential of a word line changes. This method is mainly intended to curtail the rise time of potential of the word line, but as a method for curtailing the fall time of potential of the word line, the fall time of potential of the word line is shortened by giving a discharge current to the selected word lines of memory which are to be operated under larger capacity and lower current.

In regard to a first word line (W+) and a second word line (W−) to which a memory cell is connected, the first word line (W+) is provided with detecting means which detects a potential of first word line (W+) and the delay means which delays a detected output, while the second word line (W−) is provided with discharge means which allows a discharge current to flow from the first word line (W+) via the memory cell, and the second word line (W−) in accordance with an output of the delay means. In such a structure, when the selected word line is to be shifted to the non-selected condition, the discharge means turns ON in accordance with the detected output of the detecting means, allowing the discharge current to flow. As the word line turns into the non-selected condition, the potential of the first word line (W+) is lowered and when it becomes lower than the specified voltage, no detected output can be obtained.

However, the delay means causes a detected output to be applied to the discharge means even when the first word line (W+) is set to a potential which is lower than the specified value, and resultingly a discharge current flows continuously for some specified period.

Thereby, the first word line voltage is rapidly lowered and the fall time of the word line potential is curtailed. In such an existing memory device, on the occasion that the word line is to be shifted to the selected condition from non-selected condition, when a voltage of the first word line (W+) gradually rises and exceeds the specified voltage, the detecting means makes the discharge means turn on and the discharge current starts to flow during the rise of the word line voltage.

Since this discharge current flows into the transistor which is turned ON among the cross-coupled transistors within the memory cell from the first word line (W+), a large amount of charges are stored in the base and collector of the transistor which is turned ON.

Therefore, when inverted data is written into this memory cell, in other words, when the transistors which are turned ON among the crosscoupled transistors are turned OFF, a large amount of charges being stored must be absorbed. For this purpose, it is required to give a heavy write current to the memory cell.

Moreover, a heavy discharge current on the first word line (W+) brings about reduction of the word line potential due to a voltage drop of the word line.

Further, a heavy discharge current flowing through the first word line (W+) causes a heavy base current to flow into the word line driver transistor, resulting in reduction of base potential due to a voltage drop by the resistor existing between the base of the word line driver transistor and ground.

Thereby, a potential of the word line which is lower than the base potential by $V_{BE}$ of the word line driver transister is lowered even.

When the discharge current flows as explained above, the voltage of the first word line (W+) is lowered and resultingly the voltage of the selected word lines comes close to the voltage under the non-selected condition, thus reducing noise margin.

SUMMARY OF THE INVENTION

It is an object of the present invention to provide a semiconductor memory device which assures short fall time of the word line potential without allowing the write current of memory to increase.

It is another object of the present invention to provide a semiconductor memory device which assures a sufficiently large noise margin.

In order to attain the abovementioned objects, the present invention discloses a semiconductor memory device providing a circuit for applying discharge current to selected word lines, wherein a circuit for detecting a change of address signal is provided, and thereby said discharge current is temporarily applied only when said selected word lines are shifted to the non-selected condition.

BRIEF DESCRIPTION OF THE DRAWINGS

FIG. 1 shows an embodiment of the present invention.

FIG. 2A shows the potential change of node B of FIG. 1.

FIG. 2B shows the potential change of node C of FIG. 1.

FIG. 2C shows the potential change of the word line of FIG. 1.

DESCRIPTION OF THE PREFERRED EMBODIMENT

FIG. 1 shows an embodiment of the present invention. DEC1 . . . DECn are decoders; WD1 . . . WDn are word line drivers; $W_1^+$ . . . $W_n^+$ are positive word lines; $W_1^-$ . . . $W_n^-$ are negative word lines (hole lines); $B_1$, $\overline{B}_1$, . . . $B_m$, $\overline{B}_m$ are bit lines; $MC_{11}$ . . . $MC_{nm}$ are memory cells of emitter detection type to be connected to these lines. The decoders DEC1 . . . DECn respectively have a plurality of diodes d. The signals $\overline{A}_1$, $A_1$, $\overline{A}_2$, $A_2$, . . . are generated by the input gates $IG_1$, $IG_2$, . . . $IG_n$ corresponding to each address input $AI_1$, $AI_2$, . . . , $AI_n$ and selectively applied to the diodes d. As is well known, the word lines $W_i^+$ are selected through the one word line driver among $WD_1$ . . . $WD_n$ only when all inputs for plural diodes within each decoder are H (high) level. This condition is established simultaneously for only one decoder, at least one input of the remaining decoders is L (low) level and the word lines corresponding to these are all kept at the nonselected level. $T_1$ is the positive word line $W_i^+ (i=1, 2, \ldots, n)$ level detection transistor and its emitter output charges the time constant circuit RC. The charging level E of the time constant circuit RC becomes the base voltage of discharge transistor $T_2$ which is connected to the negative word line $W_i^-$. These transistors $T_1$, $T_2$ and time constant circuit RC are provided for each word line and the current switch (discharge circuit DIS) for discharge current $I_{DIS}$ is formed with the emitters of all transistors $T_2$ connected in common.

In a discharge circuit DIS having such structure, since the point E of the time constant circuit RC connected to the selected word line $W_i^+$ becomes highest in level, the corresponding transistor $T_2$ turns ON, allowing the discharge current $I_{DIS}$ to flow into the negative word line $W_i^-$. This present invention allows such current $I_{DIS}$ to flow temporarily only when the selected word line $W_i^+$ shifts to the non-selected level from the selected level. In other words, while the selected word line $W_i^+$ rises to the selected level from the non-selected level and the selected level is maintained continuously under the normal condition, the current $I_{DIS}$ is not applied to the negative word line $W_i^-$.

In practicel, a control transistor $T_3$ is additionally provided for the current switch for the current $I_{DIS}$ And the base potential C is always set higher than the potential of point E of the time constant circuit RC connected to the selected word line.

Thereby, the current $I_{DIS}$ normally flows into the transistor $T_3$. The potential of point E of the selected word line $W_i^+$ side becomes highest only during the time the potential of point C is lowered, and the current $I_{DIS}$ flows into the negative word line $W_i^-$ through the transistor $T_2$. The base potential C is generated through the route from the address change detecting circuits $Z_1 \ldots Z_n$ to the delay/shaping circuit DLY. An address change detecting circuit is provided for each address input. $Z_1$ is provided for the address input $AI_1$ and is composed of a current switch consisting of transistors $T_4$ to $T_6$. $Z_n$ is provided for the input $AI_n$. Since the reference voltage $V_{R2}$ is set between the voltage at which the waveforms cross when the signals $A_i$, $\bar{A}_i$ change over and the H level of signal $\bar{A}_i$, either transistors $T_4$ or $T_5$ turns ON under the normal condition where the address input does not change. Thus, the current switch gives the current $I_B$ thereto. When the address input $AI_i$ changes, the conditions $V_{R2} > A_i$ and $V_{R2} > \bar{A}_i$ are satisfied temporarily, and therefore the current $I_B$ flows into the resistor $R_1$ through the transistor $T_6$. Since the collectors of transistors $T_6$ in the other address change detecting circuits are all connected to the connecting point B of the collector of transistor $T_6$ and the resistor $R_1$, if any of the address inputs $AI_1$, $AI_2$, $\ldots$ changes, a current flows into the resistor $R_1$. When the current $I_B$ flows into the resistor $R_1$, the potential of point B temporarily lowers as shown in FIG. 2A. The diode D provided in parallel with the resistors $R_1$ is a clamping diode which prevents fluctuation of potential at the point B, which may occur due to a difference of current flowing into the resistor $R_1$. As will be obvious from the above explanation, a reduction of potential at the point B forecasts a change of voltage of the word line which may occur thereafter. $W_i^+$ of FIG. 2C indicates the potential change of the word line which shifts from the selected condition the non-selected condition, while $W_j^+$ indicates that of the word line which shifts from the non-selected to selected condition. As shown in the operating waveform of the same figure, a drop of the potential at the point B generally does not cover the cross point of potential on the word lines $W_i^+$ and $W_j^+$. Therefore, after the potential of the point B is shifted by the transistor $T_7$, the width of the waveform of the potential is enlarged by the delay/shaping circuit DLY consisting of the adequate number of AND gates AND, and the OR gates OR, then an output of such DLY is used as the base potential for controlling the transistor $T_3$, as explained above. Thereby, only during the short period where the base potential C becomes low level, namely only in the hatched period where the selected word line $W_1^+$ is shifted to the non-selected level, the discharge current $I_{DIS}$ flows into the corresponding negative word line.

As a result, the discharge current $I_{DIS}$ accurately flows only when the potential of the word line falls. This is a most important condition. Thereby, the voltage of the selected word line rises quickly and the discharge current $I_{DIS}$ does not flow when the selected word line voltage rises and during the normal condition.

Thus, the write current no longer increases, nor does the noise margin decrease.

We claim:

1. A selection circuit for a semiconductor memory device having word lines and being operatively connected to receive address signals, and selection circuit comprising:
   a discharge current circuit including a first transistor for discharging a word line via said first transistor;
   a detection circuit which detects changes in the address signals and which provides a detected output varying in accordance with said detected change in the address signals; and
   a second transistor operatively connected to said detection circuit and to said first transistor to form a current switch together with said first transistor, said second transistor turns OFF in accordance with the detected output of said detection circuit so that a discharge current flows temporarily through said word line only when said first transistor turns ON due to the detected change in the address signals.

2. A selection circuit for a semiconductor memory device as set forth in claim 1, further comprising:
   waveform shaping means connected between said detection circuit and said second transistor for shaping said detected output and for providing the shaped detected output to said second transistor.

3. A selection circuit for a semiconductor memory device as set forth in claim 2, wherein said waveform shaping means comprises a means for delaying said detected output and a means for providing a signal varying in accordance with the logical OR of said detected output and said delayed signal.

4. A selection circuit for a semiconductor memory device as set forth in claim 1, wherein said detection circuit comprises a third transistor which receives a first one of said address signals at the base thereof, a fourth transistor which receives a second one of said address signals which is complementary to the first address signal at the base thereof and a fifth transistor to which base a first reference voltage is applied, and the emitters of said third, fourth and fifth transistors are connected in common.

5. A selection circuit for a semiconductor memory device as set forth in claim 4, wherein said first reference voltage is higher than the voltage at which said first address signal and said second address signal become the same level during the time said first and second address signals are being mutually inverted but lower than said high level.

6. A selection circuit for a semiconductor memory device having word lines and being operatively connected to receive address signals, said selection circuit comprising:

a discharge current circuit including a first transistor for discharging a word line;

detecting means for detecting changes in the address signals and for providing a detected output varying in accordance with said detected changes in the address signals, said detecting means including a second transistor which together with said first transistor forms a current switch, said second transistor is turned OFF in accordance with said detected output for effecting a temporary flow of discharge current through said word line only when said first transistor turns ON due to said detected changes in said address signals.

7. A selection circuit for a semiconductor memory device as in claim 6, wherein said detecting means includes a third transistor for receiving a first one of said address signals at its base, a fourth transistor for receiving at its base a second one of said address signals complementary to said first address signal, and a fifth transistor receiving at its base a first reference voltage, the emitters of said third, fourth and fifth transistors all being connected in common.

8. A selection circuit for a semiconductor memory device as in claim 6, further comprising:

waveform shaping means, operatively connected to said detecting means and to said second transistor, for shaping said detected output and for providing the shaped detected output to said second transistor.

9. A selection circuit for a semiconductor memory device as in claim 8, wherein said waveform shaping means comprises a means for delaying the detected output and a means for providing a signal varying in accordance with the logical OR of said detected output and said delayed signal.

* * * * *